United States Patent
Bae et al.

(10) Patent No.: US 8,072,046 B2
(45) Date of Patent: Dec. 6, 2011

(54) THROUGH-ELECTRODE, CIRCUIT BOARD HAVING A THROUGH-ELECTRODE, SEMICONDUCTOR PACKAGE HAVING A THROUGH-ELECTRODE, AND STACKED SEMICONDUCTOR PACKAGE HAVING THE SEMICONDUCTOR CHIP OR PACKAGE HAVING A THROUGH-ELECTRODE

(75) Inventors: Han Jun Bae, Gyeonggi-do (KR); Jong Hoon Kim, Gyeonggi-do (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 531 days.

(21) Appl. No.: 12/209,584

(22) Filed: Sep. 12, 2008

(65) Prior Publication Data
US 2009/0261458 A1 Oct. 22, 2009

(30) Foreign Application Priority Data

Apr. 21, 2008 (KR) .................. 10-2008-0036623

(51) Int. Cl.
*H01L 23/538* (2006.01)
*H05K 1/02* (2006.01)

(52) U.S. Cl. ............... 257/621; 257/774; 257/E23.011; 257/E23.067; 257/E23.145; 257/E23.174; 361/728; 361/736; 361/748

(58) Field of Classification Search .................. 257/621, 257/774, E23.011, E23.067, E23.145, E23.174; 361/728, 736, 748
See application file for complete search history.

(56) References Cited

U.S. PATENT DOCUMENTS

| | | | |
|---|---|---|---|
| 6,709,978 B2 | 3/2004 | Geusic et al. | |
| 7,345,350 B2 * | 3/2008 | Sinha | 257/449 |
| 7,898,063 B2 * | 3/2011 | Lindgren et al. | 257/621 |
| 2002/0190375 A1 * | 12/2002 | Mashino et al. | 257/734 |
| 2006/0035416 A1 * | 2/2006 | Savastiouk et al. | 438/125 |
| 2006/0220182 A1 * | 10/2006 | Uchiyama | 257/621 |
| 2007/0045844 A1 | 3/2007 | Andry et al. | |
| 2007/0132105 A1 * | 6/2007 | Akram et al. | 257/774 |
| 2007/0290300 A1 * | 12/2007 | Kawakami | 257/621 |
| 2008/0237806 A1 * | 10/2008 | Uchiyama | 257/621 |
| 2009/0212438 A1 * | 8/2009 | Kreupl et al. | 257/773 |

FOREIGN PATENT DOCUMENTS

JP 2000-307225 A 11/2000
JP 2006-019455 A 1/2006

* cited by examiner

*Primary Examiner* — Eugene Lee
*Assistant Examiner* — Peniel M Gumedzoe
(74) *Attorney, Agent, or Firm* — Ladas & Parry LLP

(57) ABSTRACT

A stacked semiconductor package includes a first semiconductor package having a first semiconductor chip having a first pad and a through-hole passing through a the portion corresponding to the pad; a second semiconductor package disposed over the first semiconductor package, and including a second semiconductor chip having a second pad disposed at a portion corresponding to the first pad and blocking the through-hole; and a through-electrode disposed within the through-hole, and having a pillar shaped core supported by the second pad, a through-electrode unit disposed over a surface of the core and electrically connected with the second pad, a first metal layer interposed between the core and the through electrode unit, and a second metal layer interposed between an inner surface of the first semiconductor chip formed by the through-hole and the through-electrode unit.

16 Claims, 5 Drawing Sheets

THROUGH-ELECTRODE, CIRCUIT BOARD HAVING A THROUGH-ELECTRODE, SEMICONDUCTOR PACKAGE HAVING A THROUGH-ELECTRODE, AND STACKED SEMICONDUCTOR PACKAGE HAVING THE SEMICONDUCTOR CHIP OR PACKAGE HAVING A THROUGH-ELECTRODE

CROSS-REFERENCE TO RELATED APPLICATIONS

The present application claims priority to Korean patent application number 10-2008-0036623 filed on Apr. 21, 2008, which is incorporated herein by reference in its entirety.

BACKGROUND OF THE INVENTION

The present invention relates generally to a through-electrode, a circuit board having the same, a semiconductor package having the same and a stacked semiconductor package having the semiconductor package. In recent, a semiconductor chip that stores and processes massive data and a semiconductor package including the semiconductor chip have been developed.

The efforts are on-going to develop a stacked semiconductor package having at least two electrically connected semiconductor chips stacked therein for further enhancement of data storing capacity and data processing speed.

Conductive wires are conventionally used for providing electrical connection between the stacked semiconductor chips in a package; however, electrical connection by the conductive wires in a package leads to various undesirable problems such as signal delays in the package, the stacked package volume increase, etc.

Accordingly, there is a need for providing a semiconductor package having two or more semiconductors chips stacked therein, where the requisite electrical connections are securely made between the stacked semiconductor chips without the undesirable problems evidenced in the conventional semiconductor packages utilizing conductive wires or other conventional electrical connection techniques.

SUMMARY OF THE INVENTION

Against this backdrop, embodiments of the present invention have been developed. Embodiments of the present invention are directed to a transistor of a through-electrode that significantly shortens a fabrication time and prevents generation of a defect such as a void.

Also, embodiments of the present invention are directed to a circuit board that has the through-electrode.

Further, embodiments of the present invention are directed to a semiconductor package that has the through-electrode.

Furthermore, embodiments of the present invention are directed to a stacked semiconductor package that includes the semiconductor package having the through-electrode.

In one embodiment, a through electrode comprises a core disposed within a through-hole and having a pillar shape; a through-electrode unit covering the core; a first metal layer interposed between the core and the through-electrode unit; and a second metal layer formed over the through-electrode unit.

The core includes any one of an insulator and metal.

The core includes any one of a cylinder or a polygonal prism.

The first and second metal layers include at least one of a metal seed layer, a gold layer and a nickel layer, respectively.

The through-electrode unit includes a metal plated layer. The metal plated layer includes copper.

Alternatively, the through-electrode unit includes solder.

In another embodiment, a circuit board comprises a board body having a through-hole that passes through a first face and a second face opposing to the first face; a first interconnection disposed over the first face and disposed at the periphery of the through-hole; a second interconnection disposed over the second face and disposed at the periphery of the through-hole; and a through-electrode disposed within the through-hole, and having a core having a pillar shape, a through-electrode unit disposed over a surface of the core and electrically connected with the first and second interconnections, a first metal layer interposed between the core and the through-electrode unit and a second metal layer interposed between the through-electrode unit and an inner surface of the board body formed by the through-hole.

In further another embodiment, a semiconductor package comprises a semiconductor chip having a through-hole; and a through-electrode disposed within the through-hole, and having a core having a pillar shape, a through-electrode unit disposed over a surface of the core, a first metal layer interposed between the core and the through-electrode unit and a second metal layer interposed between the through-electrode unit and an inner surface of the board body formed by the through-hole.

The semiconductor package may further comprise a pad disposed at a periphery of the through-hole and electrically connected with the through-electrode unit.

The core includes any one of an insulator and metal.

The core includes any one of a cylinder or a polygonal prism.

A space between the inner surface and the surface of the core is uniform.

The first and second metal layers include at least one of a metal seed layer, a gold layer and a nickel layer, respectively.

The through-electrode unit includes any one of copper and solder.

In yet another embodiment, a stacked semiconductor package comprises a first semiconductor package having a first semiconductor chip having a first pad and a through-hole passing through a the portion corresponding to the pad; a second semiconductor package disposed over the first semiconductor package, and including a second semiconductor chip having a second pad disposed at a portion corresponding to the first pad and blocking the through-hole; and a through-electrode disposed within the through-hole, and having a pillar shaped core supported by the second pad, a through-electrode unit disposed over a surface of the core and electrically connected with the second pad, a first metal layer interposed between the core and the through electrode unit, and a second metal layer interposed between an inner surface of the first semiconductor chip formed by the through-hole and the through-electrode unit.

The core includes any one of an insulator and metal.

The core includes any one of a cylinder or a polygonal prism.

A space between the inner surface and the surface of the core is uniform.

The first and second metal layers include at least one of a metal seed layer, a gold layer and a nickel layer, respectively.

The through-electrode unit includes any one of copper and solder.

DESCRIPTION OF SPECIFIC EMBODIMENTS

Two or more semiconductor memory chips, or two or more semiconductor packages having the multiple chips stacked therein, or even a combination of chips and packages can be stacked in a semiconductor package. The stacked components in a package are electrically connected to each other. Hereinafter, any of the permissible stacked components will be referred to as a "semiconductor chip" which term shall mean not only the semiconductor memory chip but also any other memory components that are packageable in a semiconductor package either presently or foreseeably. According to the present invention, a through-hole is formed in each of the stacked semiconductor chips, and a through-hole electrode is formed inside the through-holes to provide electrical connection between the stacked semiconductor chips.

To form a through-electrode inside the through-holes, a metal (such as copper) plating or a solder reflow technique may be used. However, using a metal plating process to form a through-electrode in a stacked semiconductor package requires a lengthy period of time while a void can be easily formed in the through-electrode. Using a solder reflow technique to form a through-electrode in a stacked semiconductor package is not considered any better than a metal plating technique as it does not prevent the problems of creating voids in the through-electrode.

Figure 1:
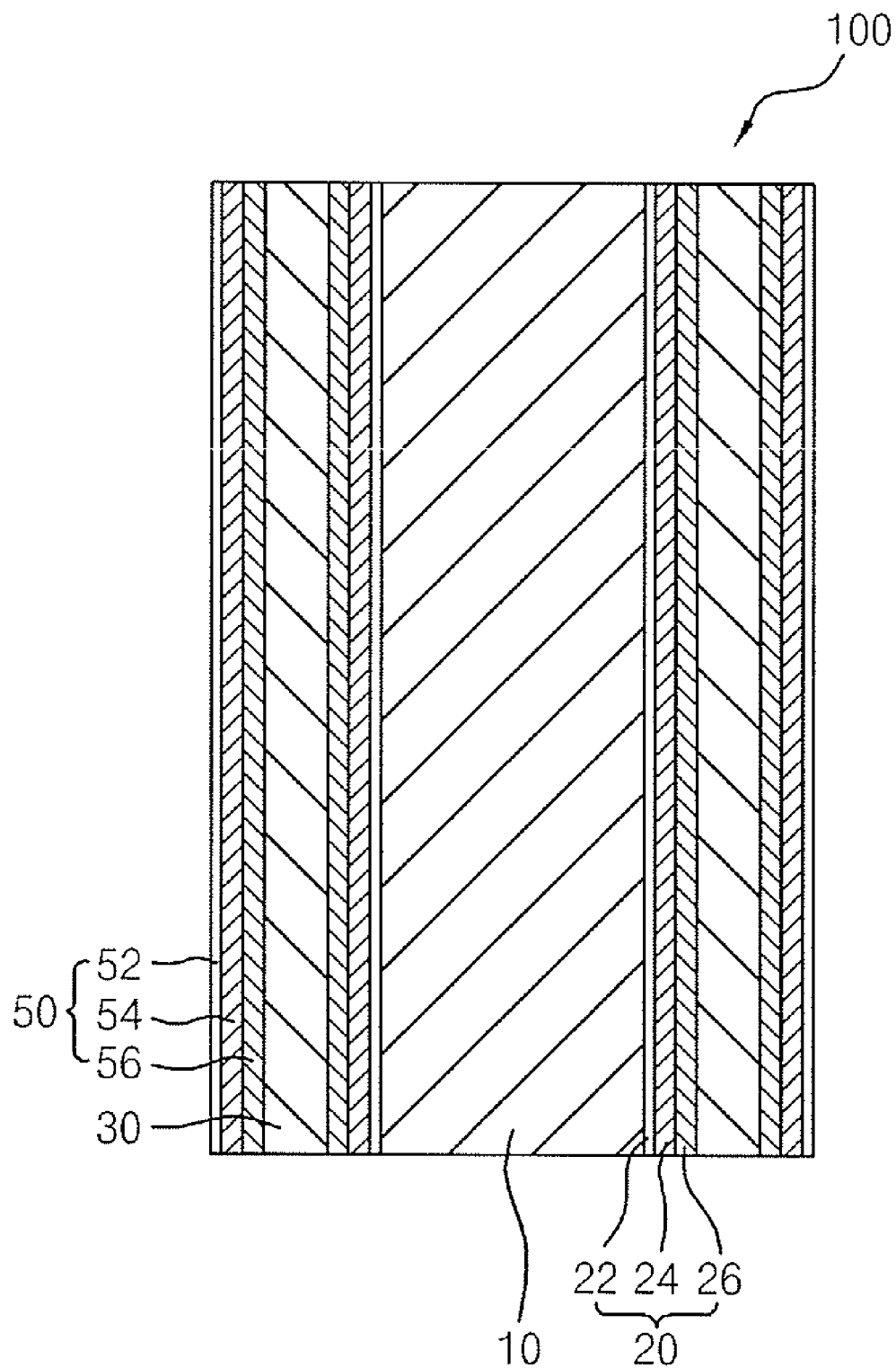
FIG. 1 is a cross-sectional view of a through-electrode in accordance with an embodiment of the present invention.
Figure 2:
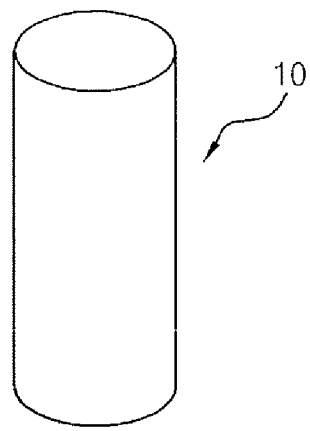
FIG. 2 is a perspective view showing an example of a core shown in FIG. 1.
Figure 3:
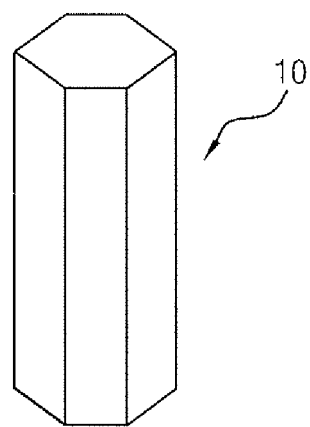
FIG. 3 is a perspective view showing another example of the core shown in FIG. 1.

FIG. 1 is a cross-sectional view showing a through-electrode 100 in accordance with an embodiment of the present invention. Each through-electrode 100 has a core 10, examples of which are shown in FIGS. 2-3. Very novel techniques to electrically connect the stacked semiconductor chips via through-holes according to various embodiments of present invention are presented herein, which would not require lengthy time as in the case of a metal plating and would not cause formation of voids in the through-electrodes. This is accomplished through utilizing, inter alia, the core 10 (for example, a resin bar) inserted into the a through-hole formed through a plurality of stacked semiconductor chips, silicon substrates, packages, etc. Then, conductive materials such as solder are formed between the core 10 and the through-hole having the core 10 inserted therein, and thereby providing electrical connection between the stacked components.

Referring to FIG. 1, a through-electrode 100 comprises a core 10, a first metal layer 20, a through-electrode unit 30, and a second metal layer 50.

Referring to FIGS. 2-3, the structure of a core 10 is generally in an elongated shape having a length (e.g., a cylindrical shape as in FIG. 2, a polygonal prism shape as in FIG. 3, etc.) but is not just limited any certain specific shape or structure such as those shown in FIGS. 2-3.

The core 10 may be made from an insulator material such as synthetic resin or a conductive material such as a metal. In an embodiment of the present invention, the core 10 is an insulator such as a cylindrical resin bar.

The first metal layer 20 is formed over the entire lengthwise surface of the elongated core 10.

The first metal layer 20 comprises one or more of a metal seed layer 22, a gold layer 24, and a nickel layer 26 according to an embodiment of the present invention.

The metal seed layer 22 can be formed on the surface of the core 10, and the gold layer 24 can be formed on the metal seed layer 22 through an electroplating process. Alternatively, the gold layer 24 and/or the nickel layer 24 can be formed on the surface of the core 10 through an electroless plating process without needing a metal seed layer 22 on the core 10 surface. Electroless plating is a chemical reduction process, which depends upon the catalytic reduction of the metal ions (e.g., gold or nickel) in an aqueous solution containing a chemical reducing agent and the subsequent deposition of the metal without the use of electrical energy. The driving force for the reduction of metal ions and their deposition is supplied by a chemical reducing agent in the solution.

The through-electrode unit 30 (described in detail below) is formed on the first metal layer 20 comprising one or more of the layers 22, 24, 26. The first metal layer 20 acts as a solder wetting layer if the through-electrode unit 30 includes solder or as a seed metal layer if the through-electrode unit 30 is a metal plated layer.

Thus, the first metal layer 20 is an intermediate layer formed between the through-electrode layer 30 and the core 10 according to an embodiment as shown in FIG. 1.

If the core 10 formed in a cylindrical shape, then the through-electrode unit 30 would be formed in a pipeshape.

The through-electrode unit 30 may include solder having a lower melting temperature than the first metal layer 20. Using solder to form a pipe-shaped through-electrode unit 30 over the core 10 in a through-hole would prevent a void from being formed in the through-electrode unit 30 by reducing the amount of inter metallic compound (IMC), which is generated by the solder and the first metal layer 20. In an embodiment of the present invention, either a reflow or plating process can be performed to form the through-electrode unit 30 on the first metal layer 20.

Alternatively, the through-electrode unit 30 can be a metal plated layer formed using the first metal layer 20. The metal plated through-electrode unit 30 may include copper, in which case it would significantly reduce the plating time to form the through-electrode unit 30.

Referring back to FIG. 1, the second metal layer 50 is formed on the through-electrode unit 30.

The second metal layer 50 comprises one or more of the metal seed layer 52, the gold layer 54, and the nickel layer 56.

For example, in the second metal layer 50, the nickel layer 56 is formed on the through-electrode unit 30; the gold layer 54 is formed on the nickel layer 56; and the metal seed layer 52 is formed on the gold layer 54.

Figure 4:
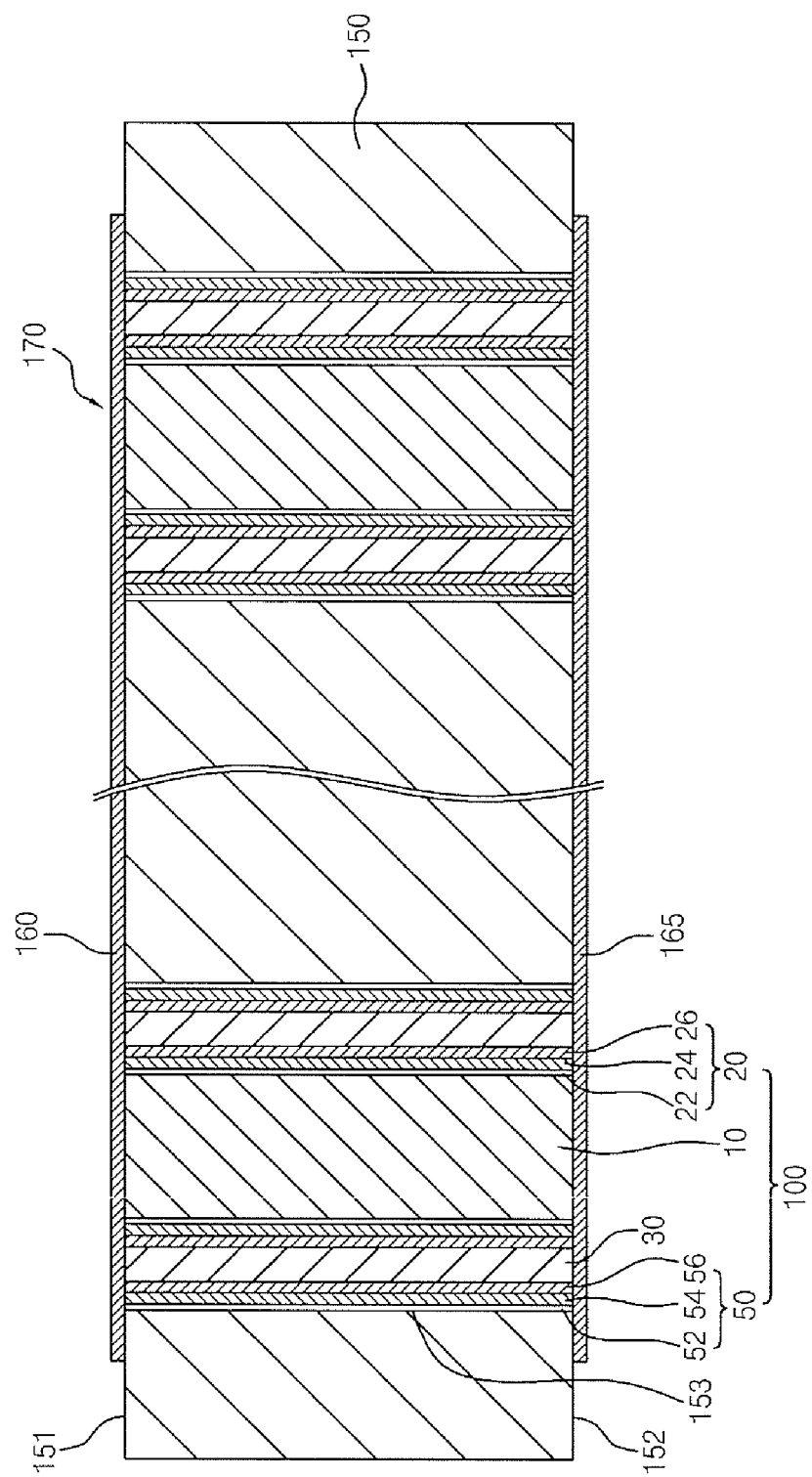
FIG. 4 is a cross-sectional view of a circuit board having the through-electrode in accordance with an embodiment of the present invention.

FIG. 4 is a cross-sectional view showing a circuit board 150 having the through-electrode 100 in accordance with an embodiment of the present invention.

Referring to FIG. 4, a circuit board 170 comprises a board body 150 having a first face 151 and a second face 152, a first interconnection 160, a second interconnection 165, and the through-electrode 100. The circuit board 170 may be a printed circuit board on which electronic devices such as semiconductor chips, transistors, diodes, inductors, etc. can be mounted.

A through-hole 153 is formed between the first face 151 and second face 152 of the board body 150 in the circuit board 170.

Formed in the through-hole 153 is the through-electrode 100 comprising the core 10 and one or more of the through-electrode unit 30, the first metal layer 20, and the second metal layer 50.

The core 10 as shown in FIG. 4 can be in a cylindrical shape or a polygonal prism shape such as those shown in FIGS. 2-3 or other similarly suitable elongated shape.

The through-electrode unit 30 is formed over the core 10, for example, in a pipe shape and may include solder or copper.

The first metal layer 20 can be formed between the through-electrode unit 30 and the core 10. The first metal layer 20 comprises at least one of the metal seed layer 22, the gold layer 24, and the nickel layer 26. In an embodiment of the present invention, the first metal layer 20 comprises the metal seed layer 22 formed on the length-wise surface of the core 10; the gold layer 24 is formed on the metal seed layer 22; and the nickel layer 26 is formed on the gold layer 24.

The second metal layer 50 is interposed between the space inside the through-hole 153 between the surfaces of the through-hole 153 and the through-electrode unit 30. The second metal layer 50 comprises one or more of the metal seed layer 52, the gold layer 54, and the nickel layer 56. In an embodiment of the present invention, the second metal layer 50 comprises the metal seed layer 52 formed on the surface of the core 10, the gold layer 54 formed on the metal seed layer 52, and the nickel layer 56 formed on the gold layer 54.

The first interconnection 160 is formed on the first face 151 of the board body 150, and the first interconnection 160 is electrically connected to one end portion of the through-electrode unit 30.

The second interconnection 165 is formed on the second face 152 of the board body 150, and the second interconnection 165 is electrically connected to the other end portion of the through-electrode unit 30 that is opposite to the end portion connected to the first interconnection 160.

Figure 5:
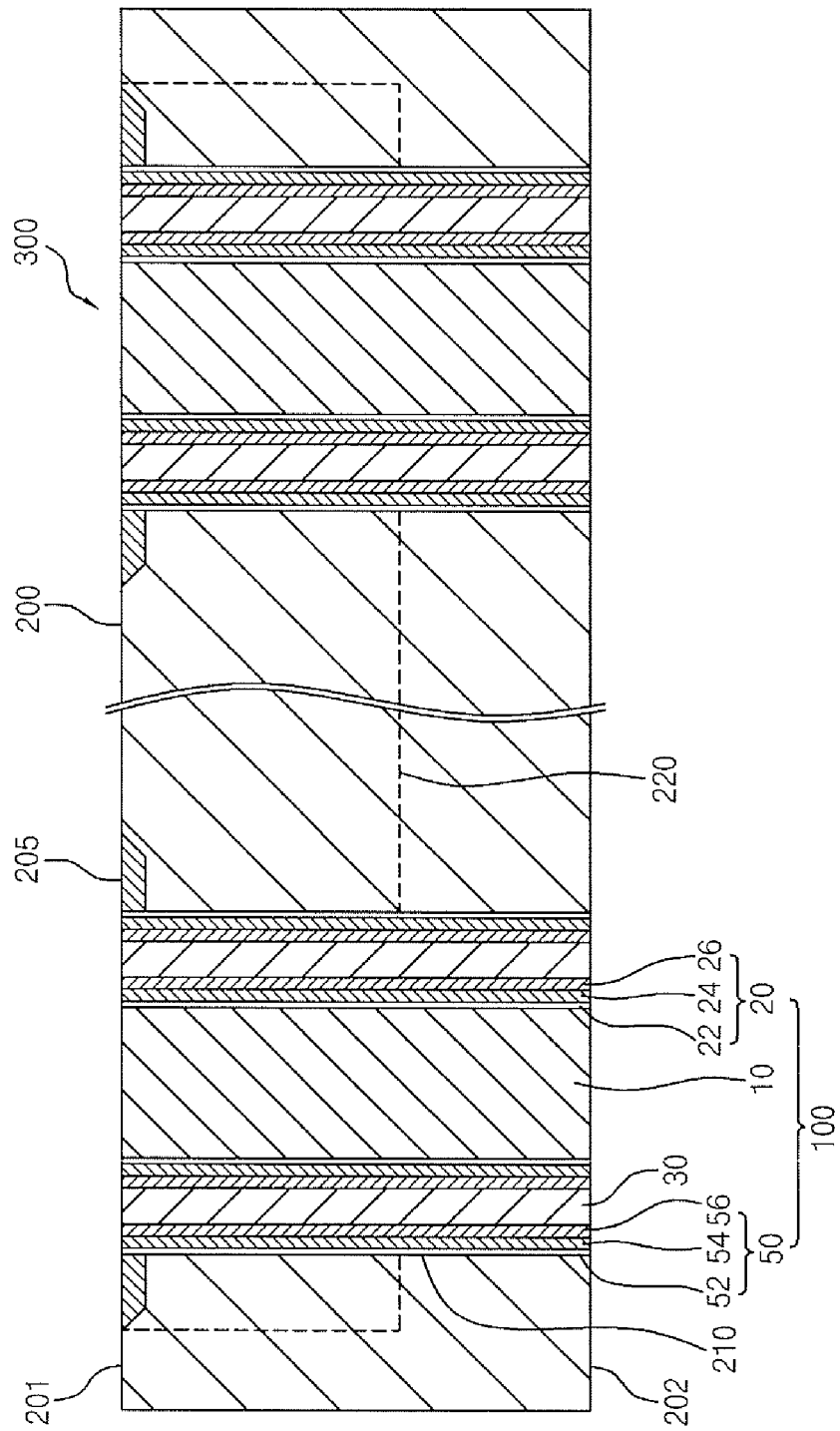
FIG. 5 is a cross-sectional view of a semiconductor package in accordance with an embodiment of the present invention.

FIG. 5 is a cross-sectional view of a semiconductor package 300 having, inter alia, a through-hole 210 and a through-electrode 100 formed therein in accordance with an embodiment of the present invention.

Referring to FIG. 5, the semiconductor package 300 comprises a semiconductor chip 200 and the through-electrode 100.

Although not limited to a single form of shape, the semiconductor chip 200 in general has a rectangular parallelepiped shape that in other words is a three-dimensional box shape having six side surfaces. The semiconductor chip 200 shown in FIG. 5 includes an upper face 201 and a lower face 202.

The semiconductor chip 200 includes a pad 205, a through-hole 210, and a circuit unit 220.

The pad 205 is disposed on the upper face 201 of the semiconductor chip 200. In an embodiment of the present invention, the pad 205 may be formed at or near an edge of the upper face 201 of the semiconductor chip 200. Alternatively, the pad 205 may be formed at or near the middle of the upper face 201 of the semiconductor chip 200.

The through-hole 210 is formed between the upper face 201 and the lower face 202 of the semiconductor chip 200. In an embodiment of the present invention, the through-hole 210 may have a circular or polygonal cross-sectional shape of the hole. The through-hole 210 passes through the semiconductor chip 200 as well as the pad 205 disposed on the upper face 201 of the semiconductor chip 200.

The circuit unit 220 is disposed within the semiconductor chip 200 and includes a data storing unit (not shown) that stores data and a data processing unit (not shown) that processes the data.

The circuit unit 220 is electrically connected to the pad 205, so that data is inputted or outputted to/from the circuit unit 220 via the pad 205.

The through-electrode 100 is disposed in the through-hole 210 of the semiconductor chip 200.

The through-electrode 100 comprises the core 10, the through-electrode unit 30, the first metal layer 20, and the second metal layer 50.

The core 10 is generally elongated in a length-wise direction and has a width-wise cross-sectional surface area that is round or polygonal in shape. Thus, the core 10 shown in FIG. 5 includes the cylindrical shape and the polygonal prism shape as shown in FIGS. 2-3. In an embodiment of the present invention, the core 10 has a cylindrical shape.

The core 10 may be made from an insulator material such as synthetic resin or a conductive material such as a metal. In an embodiment of the present invention, the core 10 is an insulator such as a cylindrical resin bar. The core 10 is disposed inside the through-hole 210 such that the distance between length-wise surface of the core 10 inside the through-hole 210 and the inner surface of the through-hole 210 is uniform.

The through-electrode unit 30 is disposed over the surface of the core 10.

In an embodiment of the present invention having the cylindrical shape core 10, the through-electrode unit 30 disposed over the core 10 is in a pipe shape.

When measured from the surface of the core 10, the through-electrode unit 30 has a uniform radial thickness.

The through-electrode unit 30 may include solder having a low melting temperature. When the through-electrode unit 30 includes solder, it is possible to prevent a void from being formed in the through-electrode unit 30 by reducing the amount of inter metallic compound (IMC), which is generated by the solder and the first and second metal layers 20 and 50.

Alternatively, the through-electrode unit 30 may be a metal plated layer, which may include copper. When the through-electrode unit 30 is a metal plated layer including copper, it will significantly reduce the plating time for forming the through-electrode unit 30.

Prior to forming the through-electrode unit 30 over the core 10, the first metal layer 20 comprising at least one of the metal seed layer 22, a gold layer 24, and the nickel layer 26 may be formed on the core 10, so that the through-electrode 30 would be formed on the first metal layer 20 in a subsequent process. In an embodiment of the present invention, the metal seed layer 22 is formed on the surface of the core 10, and the gold layer 24 and the nickel layer 26 are sequentially formed on the metal seed layer 22. The gold layer 24 can be formed on the metal seed layer 22, for example, by an electroplating method, and then the nickel layer 26 can be formed on the gold layer 24 by an electroplating method using the gold layer 24.

If the through-electrode unit 30 is formed of solder, then the nickel layer 26 of the first metal layer 20 acts as a wetting layer. Or when the through-electrode unit 30 is formed using a plating process, the nickel layer 26 of the first metal layer 20 acts as an electrode.

The second metal layer 50 is interposed between the space inside the through-hole 210 between the surfaces of the through-hole 210 and the through-electrode unit 30.

In an embodiment of the present invention, the second metal layer 50 comprises one or more of the metal seed layer 52, the gold layer 54, and the nickel layer 56. FIG. 5 shows the second metal layer 50 as including the three layers of the metal seed layer 52, the gold layer 54 and the nickel layer 56, but is also possible that the layer 54 could be a nickel layer and the layer 56 could be a gold layer.

For example, the metal seed layer 52 is disposed over the inner surface of through-hole 210 of the semiconductor chip 200. The metal seed layer 52 may include titanium, nickel, vanadium, copper, etc.

The gold layer 54 is formed on the metal seed layer 52 through an electroplating process using the metal seed layer 52. The nickel layer 56 is formed between the gold layer 54 and the through-electrode unit 30. The nickel layer 56 may be formed by an electroplating process using the gold layer 54.

If the through-electrode unit 30 is formed using solder, the nickel layer 56 acts as a wetting layer (more on this is described in detail below). Or if the through-electrode unit 30 is formed using a plating method, the nickel layer 56 acts as an electrode (more on this is also described in detail below).

Two or more semiconductor packages 300 shown in FIG. 5 can be stacked, and the electrical connection between them can be made by the through-electrodes 100, thereby capable of fabricating a stacked semiconductor package. Likewise, any combination of semiconductor chips (as in FIG. 5, 200), circuit boards (as in FIG. 4, 170), semiconductor packages (as in FIG. 5, 300), and other suitably stackable components can be stacked into a package and electrically connected between them through one or more through-holes formed therebetween.

Figure 6:
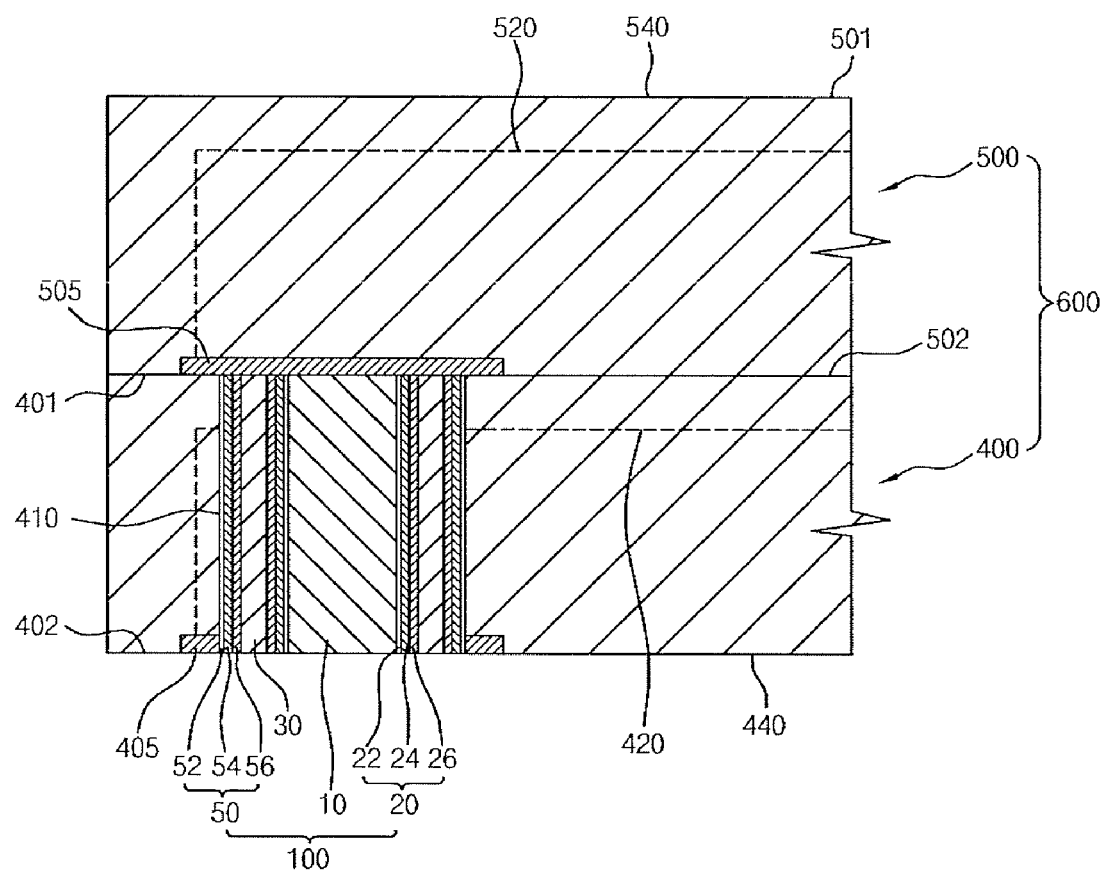
FIG. 6 is a cross-sectional view of a stacked semiconductor package in accordance with an embodiment of the present invention.

FIG. 6 is a cross-sectional view of a stacked semiconductor package in accordance with an embodiment of the present invention.

Referring to FIG. 6, a stacked semiconductor package 600 comprises a first semiconductor package 400 and a second semiconductor package 500, which are electrically connected by the through-electrode 100.

The first semiconductor package 400 comprises a first semiconductor chip 440 having a through-hole 410, a pad 405, and a circuit unit 420.

Although not limited to a single form of shape, the first semiconductor chip 440 in general has a rectangular parallelepiped shape that in other words is a three-dimensional box shape having six side surfaces. The first semiconductor chip 440 shown in FIG. 6 includes an upper face 401 and a lower face 402.

The pad 405 is disposed on the upper face 402 of the first semiconductor chip 440. In an embodiment of the present invention, the pad 405 may be formed at or near an edge of the upper face 402 of the first semiconductor chip 440. Alternatively, the pad 405 may be formed at or near the middle of the upper face 402 of the first semiconductor chip 440.

If the pad 405 is formed at or near the middle of the upper face 402 of the first semiconductor chip 440, the pad 405 can be connected with a redistribution such that one end portion of the redistribution is electrically connected to the pad 405 and the other end portion of the redistribution is extended to the edge of the upper face 402 of the first semiconductor chip 440.

In FIG. 6, the pad 405 is disposed at or near the edge of the upper face 402 of the first semiconductor chip 440.

The through-hole 410 is formed in the first semiconductor package to pass through the upper face 402 and the lower face 401. In an embodiment of the present invention, the through-hole 410 may have a circular or polygonal cross-sectional shape of the hole. The through-hole 410 passes through the first semiconductor chip 440 as well as the pad 405 disposed on the upper face 402 of the first semiconductor chip 440.

The circuit unit 420 is disposed within the first semiconductor chip 440 and includes a data storing unit (not shown) that stores data and a data processing unit (not shown) that processes the data.

The circuit unit 420 is electrically connected to the pad 405, so that the data is inputted or outputted to/from via the pad 405.

The second semiconductor package 500 is disposed on the first semiconductor package 400.

The second semiconductor package 500 comprises a second semiconductor chip 540 having a pad 505 and a circuit unit 520.

The second semiconductor chip 540 as discussed earlier can be in a rectangular parallelepiped shape that in other words is a three-dimensional box shape having six side surfaces. The second semiconductor chip 540 shown in FIG. 6 includes an upper face 502 and a lower face 501. In an embodiment of the present invention, the upper face 502 of the second semiconductor chip 540 joins the lower face 401 of the first semiconductor chip 440.

The pad 505 of the second semiconductor chip 540 is disposed on the upper face 502 of the second semiconductor chip 500. In the present embodiment, the pad 505 may be disposed at an edge of the upper face 502 of the second semiconductor chip 500. Alternatively, the pad 505 may be disposed at or near the middle of the upper face 502 of the second semiconductor chip 540, in which case the pad 505 can be connected with a redistribution, such that one end portion of the redistribution is electrically connected with the pad 505 and the other end portion of the redistribution is extended to the edge of the upper face 502 of the second semiconductor chip 540.

In an embodiment of the present invention, the pad 505 of the second semiconductor chip 540 is disposed at a position that corresponds to the pad 405 of the first semiconductor chip 440, and thus the pad 505 of the second semiconductor chip 540 blocks the through-hole 410 of the first semiconductor chip 440.

The circuit unit 520 of the second semiconductor chip 540 is disposed within the second semiconductor chip 540. And, the circuit unit 520 comprises a data storing unit (not shown) that stores data and a data processing unit (not shown) that processes the data.

The circuit unit 520 is electrically connected to the pad 505, and thus the data is inputted and outputted to/from the circuit unit 520 via the pad 505.

The through-electrode 100 is disposed within the through-hole 410 of the first semiconductor chip 440.

The through-electrode 100 comprises the core 10, the through-electrode unit 30, a first metal layer 20, and the second metal layer 50.

For example, the core 10 having a pillar shape has a cylindrical shape or a polygonal prism shape. In an embodiment of the present invention, the core 10 in a cylindrical shape is disposed within the through-hole 410 of the first semiconductor 440.

The core 10 may be made from an insulator material such as synthetic resin or a conductive material such as metal. In an embodiment of the present invention, the core 10 includes an insulator such as a resin bar.

The through-electrode unit 30 is disposed over the core 10. In the present embodiment, the through-electrode unit 30 formed over the core 10 has a pipe shape when the core 10 has a cylindrical shape.

The through-electrode unit 30 may include solder having a low melting temperature. When the through-electrode unit 30 includes solder, it is possible to prevent a void from being formed in the through-electrode unit 30 by reducing the amount of inter metallic compound (IMC), which is generated by the solder and the first and second metal layers 20 and 50.

Alternatively, the through-electrode unit 30 may be a metal plated layer formed, for example, using the first and second metal layers 20 and 50. In an embodiment of the present invention, the through-electrode unit 30 may include copper. When the through-electrode unit 30 is a metal plated layer including copper, it is possible to significantly reduce a plating time in forming the through-electrode unit 30 since a thickness of the through-electrode unit 30 is thinner than a diameter of the through-hole 410.

One end portion of the through-electrode unit 30 is electrically connected to, for example, the pad 505 of the second semiconductor chip 540.

The first metal layer 20 is interposed between the through-electrode unit 30 and the core 10.

The first metal layer 20 comprises at least one of the metal seed layer 22, the gold layer 24, and the nickel layer 26. In an embodiment of the present invention, the first metal layer 20 has the metal seed layer 22, the gold layer 24, and the nickel layer 26.

The metal seed layer 22 is formed on the core 10; the gold layer 24 is formed on the metal seed layer 22; and the nickel layer 26 is formed on the gold layer 24.

If the through-electrode unit 30 is formed of solder, the nickel layer 26 of the first metal layer 20 acts as a wetting layer. Or if the through-electrode unit 30 is formed using a plating process, the nickel layer 26 of the first metal layer 20 acts as an electrode.

The second metal layer 50 is disposed over an inner surface of the first semiconductor chip 440 formed by the through-hole 410 of the first semiconductor chip 440 of the first semiconductor package 400.

In an embodiment of the present invention, the second metal layer 50 comprises at least one of the metal seed layer 52, the gold layer 54, and the nickel layer 56. In an embodiment of the present invention, the second metal layer 50 includes the metal seed layer 52, the nickel layer 54, and the gold layer 56.

For example, the metal seed layer 52 is disposed over the inner surface through-hole 410 of the first semiconductor chip 400. The metal seed layer 52 may include titanium, nickel, vanadium, copper, etc.

The gold layer 54 is formed on the metal seed layer 52 through an electroplating process using the metal seed layer 52. The nickel layer 56 is formed between the gold layer 54 and the through-electrode unit 30. The nickel layer 56 may be formed by an electroplating process using the gold layer 54.

The nickel layer 56 acts as a wetting layer if the through-electrode unit 30 is formed using solder. Or if the through-electrode unit 30 is formed using a plating process, the nickel layer 56 acts as an electrode.

Although FIG. 6 shows two semiconductor packages as stacked, it may be possible to stack at least three semiconductor packages according to the present invention.

As is apparent from the above description, the through-electrode is disposed within the through-hole of the semiconductor chip. Therefore, there is an advantage that reduces time to be taken to form the through-electrode in the semiconductor chip and prevents a defect such as a void from being generated during the through-electrode is formed.

Although specific embodiments of the present invention have been described for illustrative purposes, those skilled in the art will appreciate that various modifications, additions and substitutions are possible, without departing from the scope and the spirit of the invention as disclosed in the accompanying claims.

What is claimed is:
1. A through-electrode, comprising:
    a core disposed within a through-hole that is formed through a component;
    a through-electrode unit covering the core;
    a first metal layer interposed between the core and the through-electrode unit; and
    a second metal layer formed over the through-electrode unit,
        wherein the through-electrode unit includes a solder having a melting temperature lower than a melting temperature of the first metal layer.
2. The through-electrode according to claim 1, wherein the core comprises any one of an insulator and metal.
3. The through-electrode according to claim 1, wherein a widthwise cross-sectional area of the core is circular or round or polygonal or of an irregular contour.
4. The through-electrode according to claim 1, wherein the first and second metal layers comprises at least one of a metal seed layer, a gold layer and a nickel layer, respectively.
5. A circuit board, comprising:
    a board body having a first face and a second face on the opposite side of the first face, wherein a through-hole is formed between the first face and the second face;
    a first interconnection on or over the first face and disposed on an opening of the through-hole on the first face;
    a second interconnection on or over the second face and disposed on an opening the through-hole on the second face; and
    a through-electrode for providing electrical connection between the circuit board and a packageable component mounted on the circuit board or between any two or more stacked packageable components mounted on the circuit board, the through-electrode comprising:
        a core elongated in the lengthwise direction in a through-hole;
        a through-electrode unit covering at least the lengthwise surface of the elongated core, wherein an electrical conductive path is formed at least through the through-electrode unit;
        a first metal layer interposed between the core and the through-electrode unit; and
        a second metal layer formed over the through-electrode unit,
            wherein the through-electrode unit includes a solder having a melting temperature lower than a melting temperature of the first metal layer.
6. A semiconductor package, comprising:
a semiconductor chip having a through-hole formed therethrough; and
a through-electrode comprising:
    a core elongated in the lengthwise direction in a through-hole;
    a through-electrode unit covering at least the lengthwise surface of the elongated core, wherein an electrical conductive path is formed at least through the through-electrode unit;
    a first metal layer interposed between the core and the through-electrode unit; and
    a second metal layer formed over the through-electrode unit,
        wherein the through-electrode unit includes a solder having a melting temperature lower than a melting temperature of the first metal layer.
7. The semiconductor package according to claim 6, further comprising:
    a pad disposed at a periphery of the through-hole and electrically connected to the through-electrode unit.
8. The semiconductor package according to claim 6, wherein the core comprises any one of an insulator and metal.

9. The semiconductor package according to claim 6, wherein the widthwise cross-sectional area of the core is circular or round or polygonal or of an irregular contour.

10. The semiconductor package according to claim 6, wherein the radial distance in a space between the surfaces of the core and the through-hole is uniform.

11. The semiconductor package according to claim 6, wherein each of the first and second metal layers comprises at least one of a metal seed layer, a gold layer, and a nickel layer.

12. A stacked semiconductor package, comprising:

a first semiconductor package having a first semiconductor chip having a first pad, wherein a through-hole is formed therethrough the first semiconductor chip and the first pad;

a second semiconductor package having a second semiconductor chip having a second pad, wherein the second semiconductor package is disposed on the first semiconductor package such that the second pad blocks the through-hole; and a through-electrode comprising:

a core elongated in the lengthwise direction in the through-hole;

a through-electrode unit covering at least the lengthwise surface of the elongated core, wherein an electrical conductive path is formed at least through the through-electrode unit;

a first metal layer interposed between the core and the through-electrode unit; and a second metal layer formed over the through-electrode unit, wherein the through-electrode unit includes a solder having a melting temperature lower than a melting temperature of the first metal layer.

13. The stacked semiconductor package according to claim 12, wherein the core comprises any one of an insulator and metal.

14. The stacked semiconductor package according to claim 12, wherein the widthwise cross-sectional area of the core is circular or round or polygonal or of an irregular contour.

15. The stacked semiconductor package according to claim 12, wherein the radial distance in a space between the surfaces of the core and the through hole is uniform.

16. The stacked semiconductor package according to claim 12, wherein each of the first and second metal layers comprises at least one of a metal seed layer, a gold layer, and a nickel layer.

* * * * *